(12) United States Patent
Hsu et al.

(10) Patent No.: US 10,177,765 B2
(45) Date of Patent: Jan. 8, 2019

(54) INTEGRATED CLOCK GATE CIRCUIT WITH EMBEDDED NOR

(71) Applicant: Intel Corporation, Santa Clara, CA (US)

(72) Inventors: Steven K. Hsu, Lake Oswego, OR (US); Amit Agarwal, Hillsboro, OR (US); Iqbal R. Rajwani, Roseville, CA (US); Simeon Realov, Portland, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/244,839

(22) Filed: Aug. 23, 2016

(65) Prior Publication Data
US 2018/0062658 A1  Mar. 1, 2018

(51) Int. Cl.
*H03K 19/00* (2006.01)
*H03K 19/0944* (2006.01)
*H03K 19/20* (2006.01)

(52) U.S. Cl.
CPC ..... *H03K 19/0944* (2013.01); *H03K 19/0013* (2013.01); *H03K 19/20* (2013.01)

(58) Field of Classification Search
CPC ............. H03K 3/037; H03K 3/356121; H03K 3/356104; H03K 3/35625; H03K 3/356052; H03K 19/0016; H03K 19/20; H03K 17/6872; G01R 31/318541; G06F 1/04
See application file for complete search history.

(56) References Cited

U.S. PATENT DOCUMENTS

| 7,570,081 | B1 * | 8/2009 | Harris | H03K 19/20 326/119 |
| 9,577,635 | B2 * | 2/2017 | Rasouli | H03K 19/0016 |
| 2001/0030567 | A1 | 10/2001 | Wood et al. | |
| 2004/0088665 | A1 | 5/2004 | Gupta | |
| 2005/0225372 | A1 | 10/2005 | Kim | |
| 2009/0267649 | A1 * | 10/2009 | Saint-Laurent | G06F 1/04 326/95 |
| 2011/0298500 | A1 | 12/2011 | Chan et al. | |
| 2014/0184271 | A1 * | 7/2014 | Gurumurthy | H03K 19/0016 326/93 |
| 2015/0116019 | A1 * | 4/2015 | Hsu | H03K 3/35625 327/203 |

(Continued)

OTHER PUBLICATIONS

International search Report and Written Opinion for international Patent Application No. PCT/US2017/041702, dated Oct. 20, 2017.

*Primary Examiner* — Seokjin Kim
(74) *Attorney, Agent, or Firm* — Green, Howard & Mughal LLP

(57) ABSTRACT

An apparatus is provided which comprises: a clock node; a test node; an enable node; and an AND-OR-INVERT (AOI) static latch coupled to the clock node, test node, and enable node, wherein the AOI static latch has embedded NOR functionality. Another apparatus comprises: a critical timing path having a pass-gate based integrated clock gate; and a non-critical timing path electrically coupled to the critical timing path, wherein the non-critical timing path includes an AND-OR-Inverter (AOI) based integrated clock gate with embedded NOR functionality.

14 Claims, 9 Drawing Sheets

(56) References Cited

U.S. PATENT DOCUMENTS

2015/0200669 A1* 7/2015 Cai .................... H03K 19/0016
              327/211
2016/0065184 A1* 3/2016 Liu ........................ H03K 3/037
              327/225

* cited by examiner

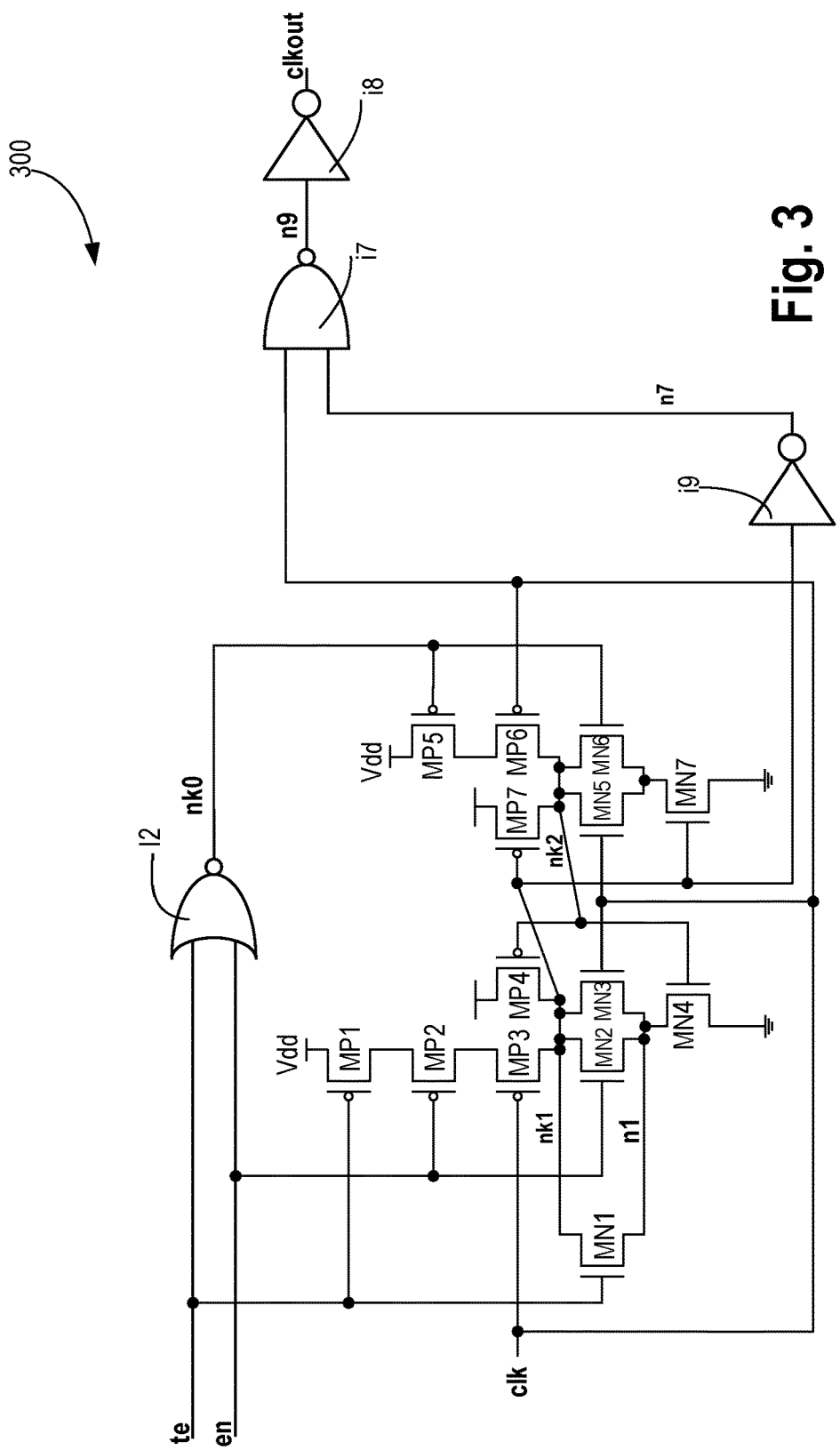

INTEGRATED CLOCK GATE CIRCUIT WITH EMBEDDED NOR

BACKGROUND

Area-efficient designs for modern microprocessors, DSP's (Digital Signal Processors), SoC's (System-on-Chip) in wearables, IoTs (Internet-of-Things), smartphones, tablets, laptops, and servers, etc., are increasingly becoming a critical factor due to the following requirements: reducing silicon cost, decreasing PCB (Printed Circuit Board) footprint, improving time-to-market (TTM), and slower scaling cadence of process technology node. These requirements all need to be met while meeting the stringent frequency and/or performance targets and power/leakage budgets.

A major component of the power dissipation in digital systems is due to charging and discharging load capacitance of circuit nodes, otherwise known as dynamic power. In today's clocked synchronous systems—microprocessors, DSP's, and SoC's in smartphones, tablets, laptops, and servers, a large percentage of the overall power dissipation (e.g., greater than 30%) is in the clock grid and final sequential load.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3 illustrates an integrated clock gate circuit with embedded NOR, according to some embodiments of the disclosure.

DETAILED DESCRIPTION

Figure 1:
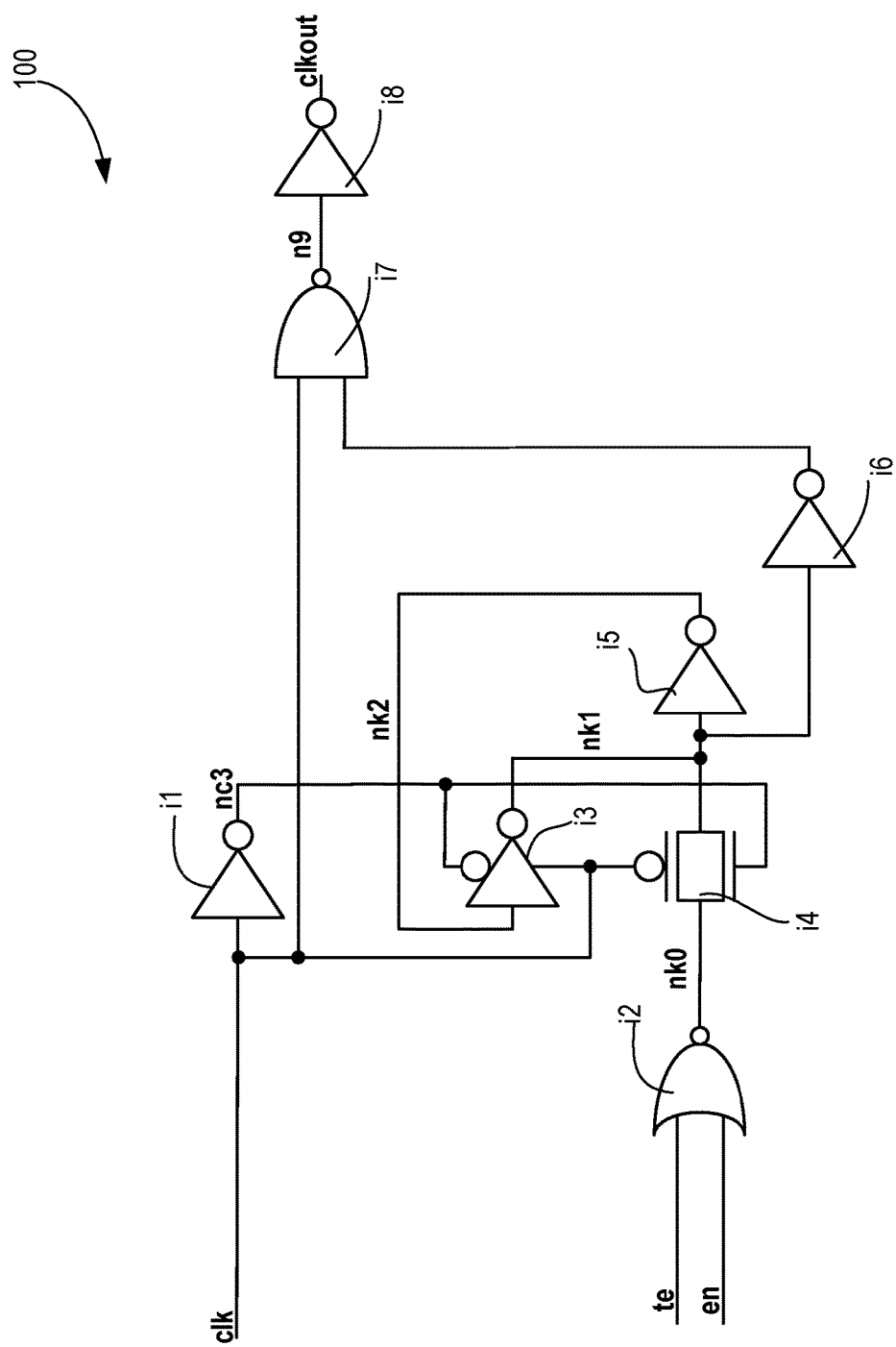
FIG. 1 illustrates an integrated clock gate circuit using a pass-gate (PG).

Clock gating reduces power by adding more logic to shut-off portions of a clock tree (or a clock distribution network) and logic data-path when not in use. The flip-flops in these shut-off portions do not have to switch states thereby saving power. Integrated clock gates are generally designed for low power consumption since they consume additional power in order to enable the extra functionality. These clock gates add additional clock load onto the high-activity un-gated portion of the clock grid, and so the clock power contribution is very high even though there are fewer instances of these clock gates. Also, in many designs, a large percentage of enable paths (e.g., approximately 90%) in a system have timing slack or have non-critical setup times.

Clock gating is generally used for reducing dynamic power on all digital synchronous building blocks from microprocessors to graphics System-on-Chips (SoCs). Fine-grain clock gating is used extensively at all levels of the clock grid to reduce the chip power as much as possible. These clock gates increase the clock power on the un-gated high activity clock nodes, in order to have the opportunity to shut-off the clock and data-path downstream to reduce power. This overhead adds towards power consumption.

Various embodiments describe a family of integrated clock gating circuits that take advantage of timing slack in non-critical enable paths to reduce the number of clocked transistors, resulting in lower power consumption for today's digital systems. In some embodiments, an integrated clock gate with embedded NOR functionality is described that minimizes the timing impact, uses less power, and is suitable for non-critical enable paths.

Compared to traditional integrated clock gate circuits, the integrated clock circuits with embedded NOR functionality of the various embodiments reduce the number of clock transistors with true-single phase clocking to lower power consumption. In some embodiments, a fully interruptible design without contention in the circuit and static CMOS (Complementary Metal Oxide Semiconductor) implementation enables robust low voltage operation. In some embodiments, integrated clock circuits with embedded NOR functionality trade off increases setup time for lower power consumption. The embedded NOR of the various embodiments minimizes (e.g., reduces) the timing impact of the integrated clock gate circuit. In some embodiments, the latch portion of the integrated clock gate circuit reduces the number of clock transistors from 6 to 3 devices, thereby reducing power on a high activity un-gated clock node. In some embodiments, the integrated clock gate circuit with embedded NOR functionality can be placed in enable paths that are non-critical. As such, clock gating efficiency of an entire logic block is not affected in accordance with some embodiments.

There are many technical effects of the various embodiments. For example, the integrated clock gates with embedded NOR functionality of various embodiments reduces the number of clock devices (e.g., from 6 to 3 for the latch portion), and reduces dynamic power up (e.g., up to 39% including AND gate contribution). The embedded NOR of various embodiments (which is separate from the discrete OR/NOR gate that receives test and enable signals) minimizes the setup time impact to maximize usage, improving the setup time (e.g., by approximately two gates of fan-out of four vs. clock gates without embedded NOR functionality). Most of the enable paths of the integrated clock gates with embedded NOR functionality have plenty of setup time margin enabling a high usage of the embodiments. For example, 90% of the enable paths have at least 1.4 F04 (fan-out of four) setup time margin. The integrated clock gates with embedded NOR functionality of various embodiments use less power compared to traditional integrated clock gates. For example, 0.5% of dynamic capacitance is reduced using integrated clock gates with embedded NOR functionality. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates an integrated clock gate circuit 100 using a pass-gate (PG). Circuit 100 comprises clock ("clk") node, test enable ("te") node, enable ("en") node, inverters i1, i3, i5, i6, and i8; PG i4, NOR gate i2, and NAND gate i7 coupled together as shown. In some cases inverter i3 is a tristate-able inverter which is controlled by clock ("clk") and its inverse. NOR gate i2 is coupled to nodes "te" and "en" that provide test enable and enable signals. Here, signal names and node names are interchangeably used. For example, "clk" may refer to clock node "clk" or clock signal "clk" depending on the context of the sentence.

The output "nk0" of NOR gate i2 is coupled to PG i4. The PG is controlled by "clk" and "nc3" (where "nc3" is an inverse of "clk"). The PG i4 is formed of p-type and n-type transistors coupled together in parallel such that the p-type transistor has a gate terminal coupled to "clk" while the n-type transistor has a gate terminal coupled to "nc3". Inverters i5 and i3 are back-to-back coupled inverters that form a memory device coupled to the PG such that the output of inverter i5 is coupled to the input of inverter i3 via node "nk2". Here, the output of inverter i3 is coupled to PG i4 and the inputs of inverters i5 and i6 via node "nk1". NAND gate i7 and inverter i8 together form a AND gate. One input of NAND gate i7 is coupled to "clk" while another input of NAND gate i7 is coupled to an output of the inverter i6. The output of NAND gate i7 is coupled to the input of inverter i8 via node n9. The output of inverter i8 is "clkout" which is the output of clock gate circuit 100. The PG i4 coupled to the memory device (inverters i5 and i3) together form a latch.

Table 1 illustrates active diffusion grids (DG) that indicate transistor widths which are active in the AND gate (e.g., combination of NAND gate i7 and inverter i8) and latch (e.g., PG i4 in combination of inverters i3 and i5) for various operating modes (e.g., when enable en=0, en=1).

TABLE 1

| Mode | AND | Latch | Total |
| --- | --- | --- | --- |
| en = 0 | 3 | 6 | 9 |
| en = 1 | 11 | 6 | 17 |

When en=0, the un-gated clock node switches 6 diffusion grids (DG) due to the latch and an additional 3 DG due to the NAND gate. When en=1, the clock "clk" switches a total of 17 DG because of the AND gate is switching. The NOR gate i2 at the input is included to allow a test mode (using "te") during debug to turn-off the clock gating feature, so that it may not impact the logic functionality of the circuits that it is gating.

Figure 2A:
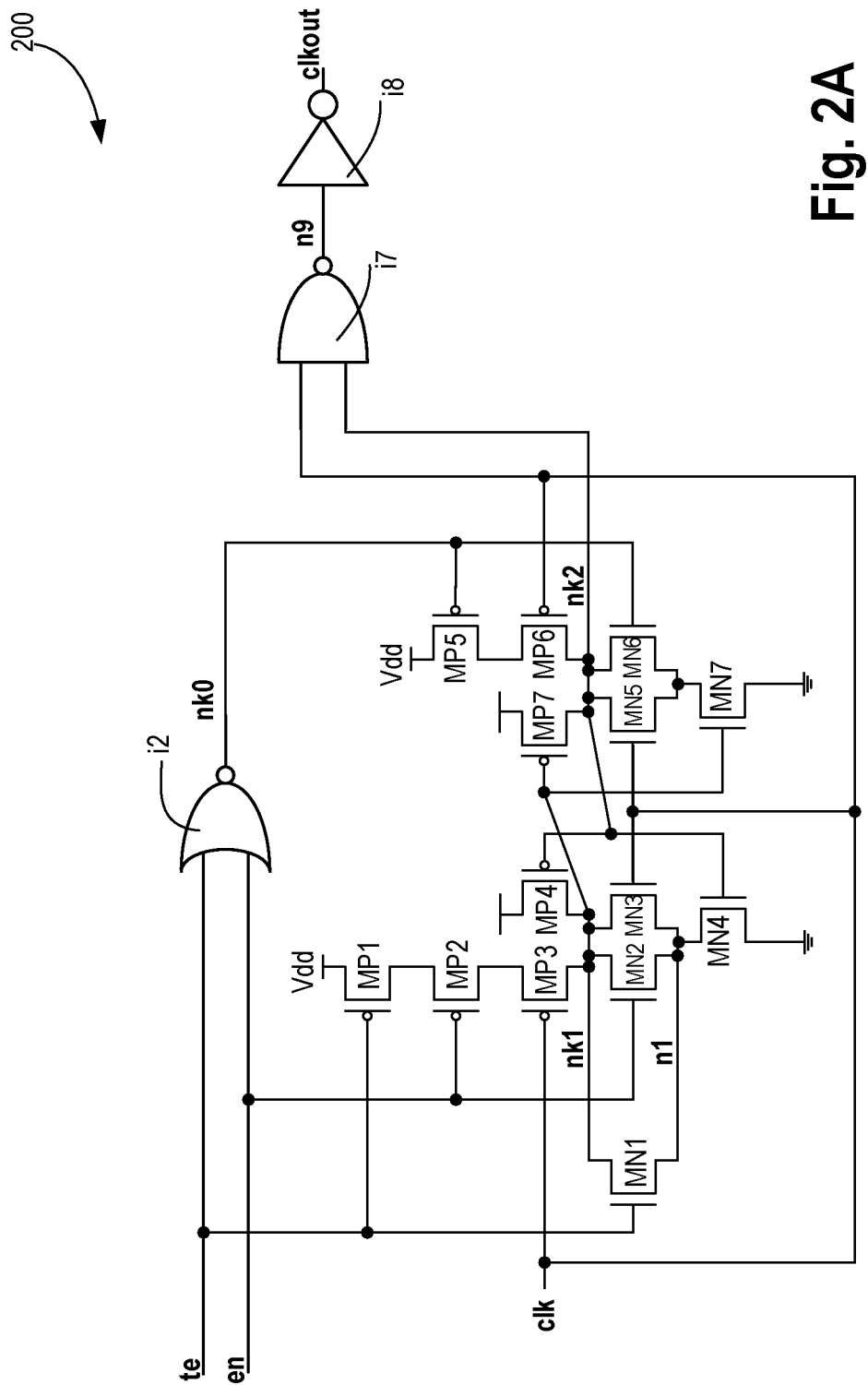
FIG. 2A illustrates an integrated clock gate circuit with embedded NOR, according to some embodiments of the disclosure.

FIG. 2A illustrates an integrated clock gate circuit 200 with embedded NOR, according to some embodiments of the disclosure. In some embodiments, circuit 200 comprises enable node "en", clock node "clk", test mode "te", NOR gate i2, NAND gate i7, inverter i8, output node clkout, AND-OR-INVERT (AOI) static latch with embedded NOR which includes first p-type transistor MP1, second p-type transistor MP2, third p-type transistor MP3, fourth p-type transistor MP4, first n-type transistor MN1, second n-type transistor MN2, third n-type transistor MN3, fourth n-type transistor MN4, fifth p-type transistor MP5, sixth p-type transistor MP6, seventh p-type transistor MP7, fifth n-type transistor MN5, sixth n-type transistor MN6, and seventh n-type transistor MN7.

In some embodiments, AOI static latch is coupled to the clock node "clk", test node "te", and enable node "en", wherein the AOI static latch has embedded NOR functionality. In some embodiments, NAND gate i7 has a first input coupled to the clock node "clk" and a second input coupled to an output "nk2" of the AOI static latch with embedded NOR functionality. In some embodiments, inverter i8 is coupled to an output "n9" of NAND gate i7, where inverter i8 is to provide the output "clkout". In some embodiments, NOR gate i2 has a first input coupled to the test node "te" and a second input coupled to the enable node "en".

In some embodiments, the first p-type transistor MP1 has a gate terminal coupled to the test node "te" and a source terminal coupled to a supply node Vdd. In some embodiments, the second p-type transistor MP2 coupled in series with the first p-type transistor MP1, where the second p-type transistor MP2 has a gate terminal coupled to the enable node "en". In some embodiments, the third p-type transistor MP3 is coupled to the second p-type transistor MP2, where the third p-type transistor MP3 has a gate terminal coupled to the clock node "clk". In some embodiments, the fourth p-type transistor MP4 is coupled to the third p-type transistor MP3 such that a drain terminal (node "nk1") of the fourth p-type transistor MP4 is coupled to a drain terminal (node "nk1") of the third p-type transistor MP3.

In some embodiments, the first n-type transistor MN1 has a gate terminal coupled to the test node "te", and a drain terminal (node "n1") coupled to the drain terminals (node "n1") of the third and fourth n-type transistors MN3 an MN4, respectively. In some embodiments, the first n-type transistor MN1 is coupled in parallel to transistors MN2 and MN3. For example, the first n-type transistor MN1 is coupled to nodes "nk1" and "n1".

In some embodiments, the second n-type transistor MN2 is coupled in series with the third p-type transistor MP3 and coupled in parallel to the first n-type transistor MN1, where the second n-type transistor MN2 has a gate terminal coupled to the test node "te". In some embodiments, the third n-type transistor MN3 is coupled in parallel to the second n-type transistor MN2, where the third n-type transistor has a gate terminal coupled to the clock node. In some embodiments, the fourth n-type transistor MN4 is coupled in series with the first MN1, second MN2, and third MN3 n-type transistors, where the fourth n-type transistor MN4 has a gate terminal coupled to a gate terminal of the fourth p-type transistor MP4.

In some embodiments, the fifth p-type transistor MP5 has a source terminal coupled to the supply node Vdd, and a gate terminal coupled to the output "nk0" of the NOR gate i2. In some embodiments, the sixth p-type transistor MP6 is coupled in series with the fifth p-type transistor MP5. In some embodiments, the seventh n-type transistor MN7 has a gate terminal coupled to the drain terminal (node "nk1") of the fourth p-type transistor MP4. In some embodiments, the drain terminal of the seventh n-type transistor MN7 is coupled to the sixth p-type transistor MP6 and the gate terminals of the fourth p-type transistor MP4 and the fourth n-type transistor MN4. In some embodiments, the seventh n-type transistor MN7 has a source terminal coupled to the supply node Vdd. In some embodiments, the fifth n-type transistor MN5 is coupled in series with the seventh p-type transistor MP7, where the fifth n-type transistor MN5 has a gate terminal coupled to the clock node "clk".

In some embodiments, the sixth n-type transistor MN6 is coupled in parallel with the fifth n-type transistor MN5, where the sixth n-type transistor MN6 has a gate terminal coupled to the output of the NOR gate i2. In some embodiments, drain terminal (node "nk2") of the sixth type transistor MP6 is coupled to the drain terminal (node "nk2") of the seventh transistor MP7.

In some embodiments, the seventh n-type transistor MN7 is coupled in series with the fifth n-type transistor MN5, where the seventh n-type transistor MN7 has a gate terminal coupled to the gate terminal of the seventh p-type transistor MP7. In some embodiments, the gate terminals of transistors MP7 and MN7 are coupled to node "nk1". In some embodiments, the gate terminals of transistors MP4 and MN4 are coupled to node nk2.

Table 2 illustrates active diffusion grids (DG) that indicate transistor widths which are active in the AND gate (e.g., combination of NAND gate i7 and inverter i8) and AOI latch with embedded NOR for various operating modes (e.g., when enable en=0, en=1).

TABLE 2

| Mode | AND | Latch | Total |
| --- | --- | --- | --- |
| en = 0 | 3 | 4 | 7 |
| en = 1 | 11 | 4 | 15 |

Compared to FIG. 1, here local clock inverter i1 of FIG. 1 is removed and as such the AOI latch has 4 DG clock transistors, which is reduced from the 6 DG of FIG. 1. Circuit 200 switches 7 DG when en=0, in accordance with some embodiments. In some embodiments, when en=1, the clock "clk" switches a total of 15 DG because of the AND gate, which is reduced from 17 DGs of FIG. 1. In some embodiments, circuit 200 reduces the dynamic power compared to the clock gate of FIG. 1. For example, circuit 200 reduces the dynamic power by up to 16% compared to the dynamic power of clock gate 100. In some embodiments, the clock pin "clk" capacitance remains constant relative to the clock pin capacitance of clock gate 100. As such, there are no back propagated clock tree effects. In some cases, the data enable pin "en" increases the pin capacitance by 66%, but if this is used in a non-critical path, this impact can be easily absorbed as extra margin.

In some examples, circuit 200 has a setup time impact of +0.4 FO4 (fan-out of four) enable (degradation) and −0.3 FO4 disable (improvement), making it a good choice if delay is critical (e.g., setup time increases by 0.4 FO4 for enable, which is a timing wise performance degradation, while setup time decreases by 0.3 FO4 for disable, which is a timing wise performance improvement). Without the embedded NOR gate, the setup time degradation may be as high as 2.2 F04 for enable and 1.8 F04 for disable, in accordance with some examples.

Figure 2B:
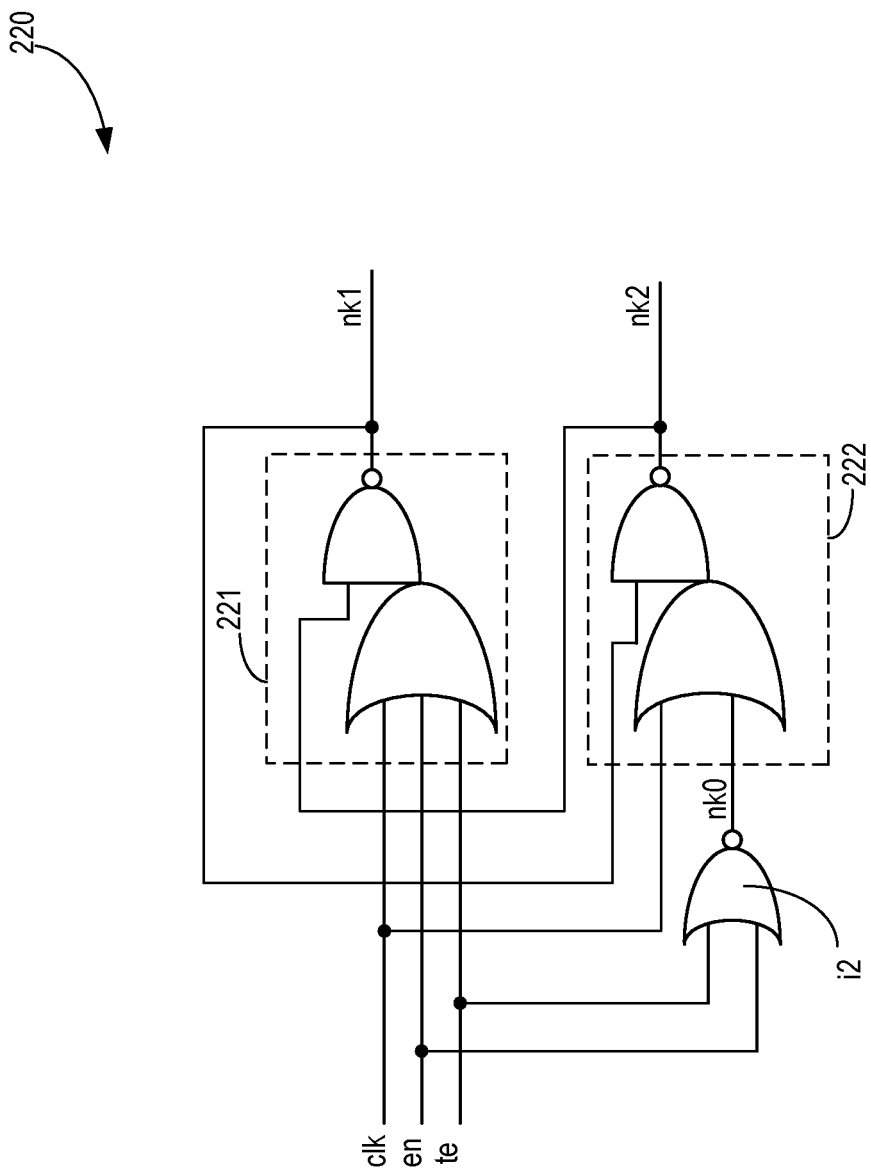
FIG. 2B illustrates a symbol view of part of the integrated clock gate circuit with embedded NOR of FIG. 2A, according to some embodiments of the disclosure.

FIG. 2B illustrates symbol view 220 of part of the integrated clock gate circuit with embedded NOR of FIG. 2A, according to some embodiments of the disclosure. It is pointed out that those elements of FIG. 2B having the same reference numbers (or names) as the elements of any other figure can operate or function in any manner similar to that described, but are not limited to such. Symbol view 220 shows complex gates 221 and 222 with embedded NOR, coupled together as shown, that form the basis of the integrated clock gate circuit with embedded NOR, in accordance with some embodiments. These complex gates implement functions of OR-AND-INVERT. Together complex gates 221 and 222 provide a function a static latch with embedded OR functionality, in accordance with some embodiments.

FIG. 3 illustrates integrated clock gate circuit 300 with embedded NOR, according to some embodiments of the disclosure. It is pointed out that those elements of FIG. 3 having the same reference numbers (or names) as the elements of any other figure can operate or function in any manner similar to that described, but are not limited to such. So as not obscure the embodiment of FIG. 3, differences between FIG. 2 and FIG. 3 are described.

Circuit 300 is suitable to drive high power level integrated clock gate circuits. In some embodiments, when NAND gate i7 and inverter i8 are made larger in size to drive greater loads, the larger NAND gate i7 may add extra capacitance to node "nk2". To reduce that capacitance on node "nk2", an inverter i8 is added between node "nk2" and the input of the NAND i7, in accordance with some embodiments.

Table 3 illustrates active diffusion grids (DG) that indicate transistor widths which are active in the AND gate (e.g., combination of NAND gate i7 and inverter i8) and AOI latch with embedded NOR for various operating modes (e.g., when enable en=0, en=1).

TABLE 3

| Mode | AND | Latch | Total |
|---|---|---|---|
| en = 0 | 3 | 4 | 7 |
| en = 1 | 11 | 4 | 15 |

Figure 4:
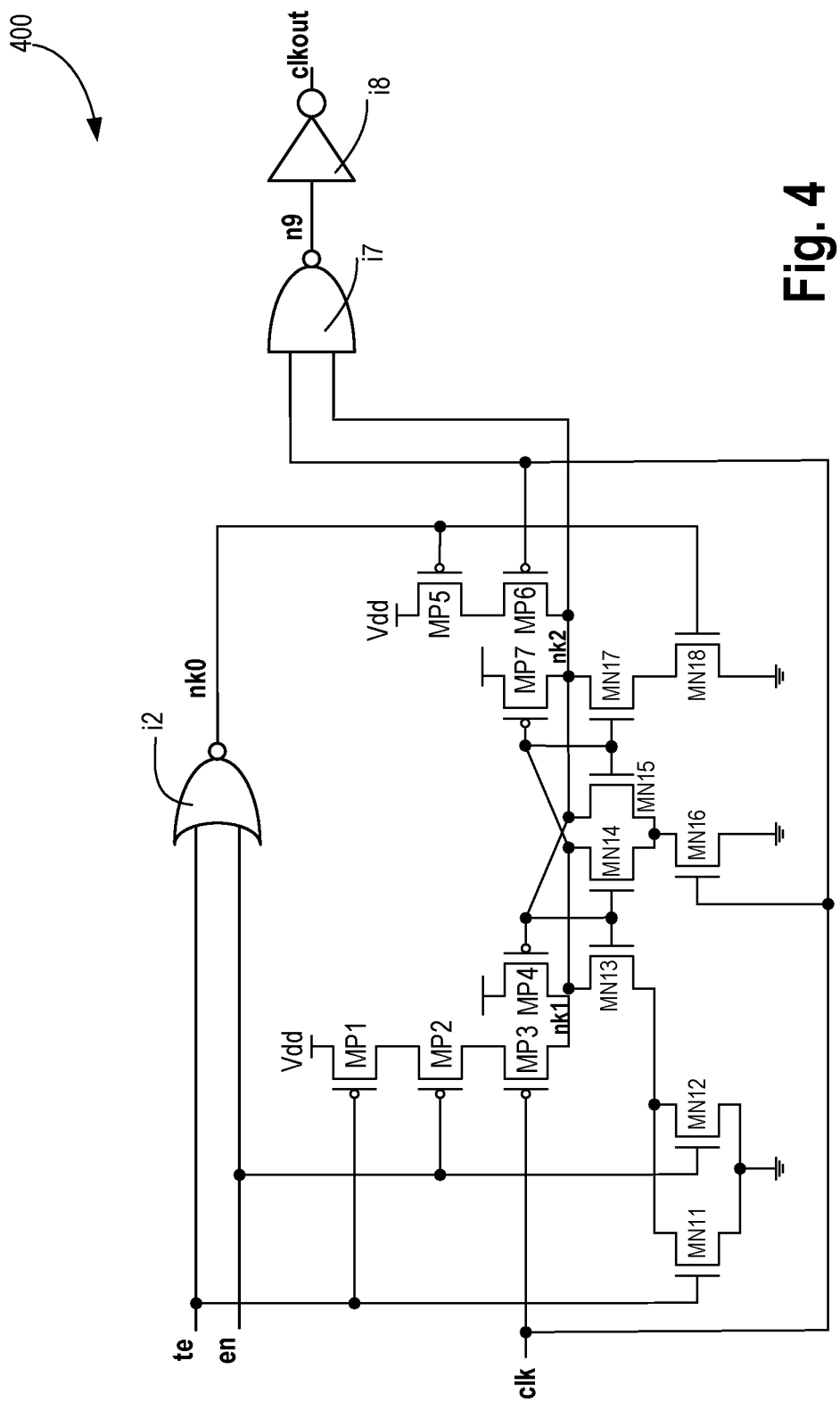
FIG. 4 illustrates an integrated clock gate circuit with embedded NOR and shared keeper, according to some embodiments of the disclosure.

FIG. 4 illustrates integrated clock gate circuit 400 with embedded NOR and shared keeper, according to some embodiments of the disclosure. It is pointed out that those elements of FIG. 4 having the same reference numbers (or names) as the elements of any other figure can operate or function in any manner similar to that described, but are not limited to such.

In some embodiments, circuit 400 comprises enable node "en", clock node "clk", test mode "te", NOR gate i2, NAND gate i7, inverter i8, output node "clkout", shared keeper latch with embedded NOR which includes first p-type transistor MP1, second p-type transistor MP2, third p-type transistor MP3, fourth p-type transistor MP4, first n-type transistor MN11, second n-type transistor MN12, third n-type transistor MN13, fourth n-type transistor MN14, fifth p-type transistor MP5, sixth p-type transistor MP6, seventh p-type transistor MP7, fifth n-type transistor MN15, sixth n-type transistor MN16, seventh n-type transistor MN17, and eighth n-type transistor MN18.

In some embodiments, shared keeper static latch is coupled to the clock node "clk", test node "te", and enable node "en", where the shared keeper latch has embedded NOR functionality. In some embodiments, NAND gate i7 has a first input coupled to the clock node "clk" and a second input coupled to an output "nk2" of the shared keeper latch with embedded NOR functionality. In some embodiments, inverter i8 is coupled to an output "n9" of NAND gate i7, wherein inverter i8 is to provide the output "clkout". In some embodiments, NOR gate i2 has a first input coupled to the test node "te" and a second input coupled to the enable node "en".

In some embodiments, the first p-type transistor MP1 has a gate terminal coupled to the test node "te" and a source terminal coupled to a supply node Vdd. In some embodiments, the second p-type transistor MP2 is coupled in series with the first p-type transistor MP1, where the second p-type transistor MP2 has a gate terminal coupled to the enable node "en". In some embodiments, the third p-type transistor MP3 is coupled to the second p-type transistor MP2, where the third p-type transistor MP3 has a gate terminal coupled to the clock node "clk". In some embodiments, the fourth p-type transistor MP4 is coupled to the third p-type transistor MP3 such that a drain terminal (node "nk1") of the fourth p-type transistor MP4 is coupled to a drain terminal (node "nk1") of the third p-type transistor MP3.

In some embodiments, the first n-type transistor MN11 has a gate terminal coupled to the test node "te", and a drain terminal coupled to the source terminal of third n-type transistor MN13. In some embodiments, the third n-type transistor MN13 is coupled is series with the third p-type transistor MP3 and the fourth p-type transistor MP4 such that the source node of transistor MN13 is coupled to node "nk1". In some embodiments, the first n-type transistor MN11 is coupled in parallel to the second n-type transistor MN12.

In some embodiments, the second n-type transistor MN12 is coupled in series with the third p-type transistor MP3 and coupled in parallel to the first n-type transistor MN11, where the second n-type transistor MN12 has a gate terminal coupled to the test node "te". In some embodiments, the gate terminal of the third n-type transistor MN13 is coupled to the gate terminal of the fourth p-type transistor MP4. In some embodiments, the fourth n-type transistor MN14 is coupled in series with the sixth n-type transistor MN16. In some embodiments, the gate terminal of sixth n-type transistor MN16 is coupled to the clock node "clk". In some embodiments, the source terminal of the fourth n-type transistors MN14 is coupled to node "nk1". In some embodiments, node "nk1" is coupled to the gate terminal of the seventh p-type transistor MP7.

In some embodiments, the fifth p-type transistor MP5 has a source terminal coupled to the supply node Vdd, and a gate terminal coupled to the output "nk0" of the NOR gate i2. In some embodiments, the sixth p-type transistor MP6 is coupled in series with the fifth p-type transistor MP5. In some embodiments, the seventh n-type transistor MN17 has a gate terminal coupled to the drain terminal (node "nk1") of the fourth p-type transistor MP4. In some embodiments, the seventh n-type transistor MN17 has a drain terminal coupled to the sixth p-type transistor MP6 and the gate terminals of the fourth p-type transistor MP4 and the third n-type transistor MN13. In some embodiments, the seventh n-type transistor MN17 has a source terminal coupled to the supply node Vdd. In some embodiments, the gate terminal of the fifth n-type transistor MN15 is coupled to the gate terminal of the seventh n-type transistor MN17 and the seventh p-type transistor MP7.

In some embodiments, the drain terminal (node "nk2") of the sixth p-type transistor MP6 is coupled to the drain terminal (node "nk2") of the seventh p-type transistor MP7. In some embodiments, the seventh n-type transistor MN17 is coupled in series with the sixth p-type transistor MP6 and the seventh p-type transistor MP7. In some embodiments, the eighth n-type transistor MN18 is coupled in series with the seventh n-type transistor MN17. In some embodiments, the gate terminal of the eighth n-type transistor MN18 is coupled to node "nk0".

Table 4 illustrates active diffusion grids (DG) that indicate transistor widths which are active in the AND gate (e.g., combination of NAND gate i7 and inverter i8) and shared keeper latch with embedded NOR for various operating modes (e.g., when enable en=0, en=1).

TABLE 4

| Mode   | AND | Latch | Total |
|--------|-----|-------|-------|
| en = 0 | 3   | 3     | 6     |
| en = 1 | 11  | 4     | 14    |

In some embodiments, by removing the need for a local clock inverter and sharing the p-type keeper devices, the shared keeper latch has 3 DG clock transistors, which is reduced from the 6 DG of FIG. 1. In some embodiments, circuit 400 switches 6 DG when en=0. In some embodiments, when en=1, the clock switches a total of 14 DG because of the AND gate (e.g., combination of NAND gate i7 and inverter i8). As such, dynamic power is reduced over circuit 100 of FIG. 1. For example, dynamic power of circuit 400 is reduced up to 39%. In some embodiments, for circuit 400 the clock pin capacitance is reduced by 14% compared to the clock pin capacitance of FIG. 1. As such, circuit 400 provides further clock tree power reduction. In some examples, data enable pin increases the pin capacitance by 66%, but when circuit 400 is used in a non-critical timing path, this impact can be absorbed. Aside from reduced "clk" pin capacitance and clock power, integrated clock gate circuit 400 may have a slightly higher setup time compared to integrated clock gate circuit 200. As such, circuit 400 can be used in a non-critical timing path providing extra power savings over circuit 200, for example.

Figure 5:
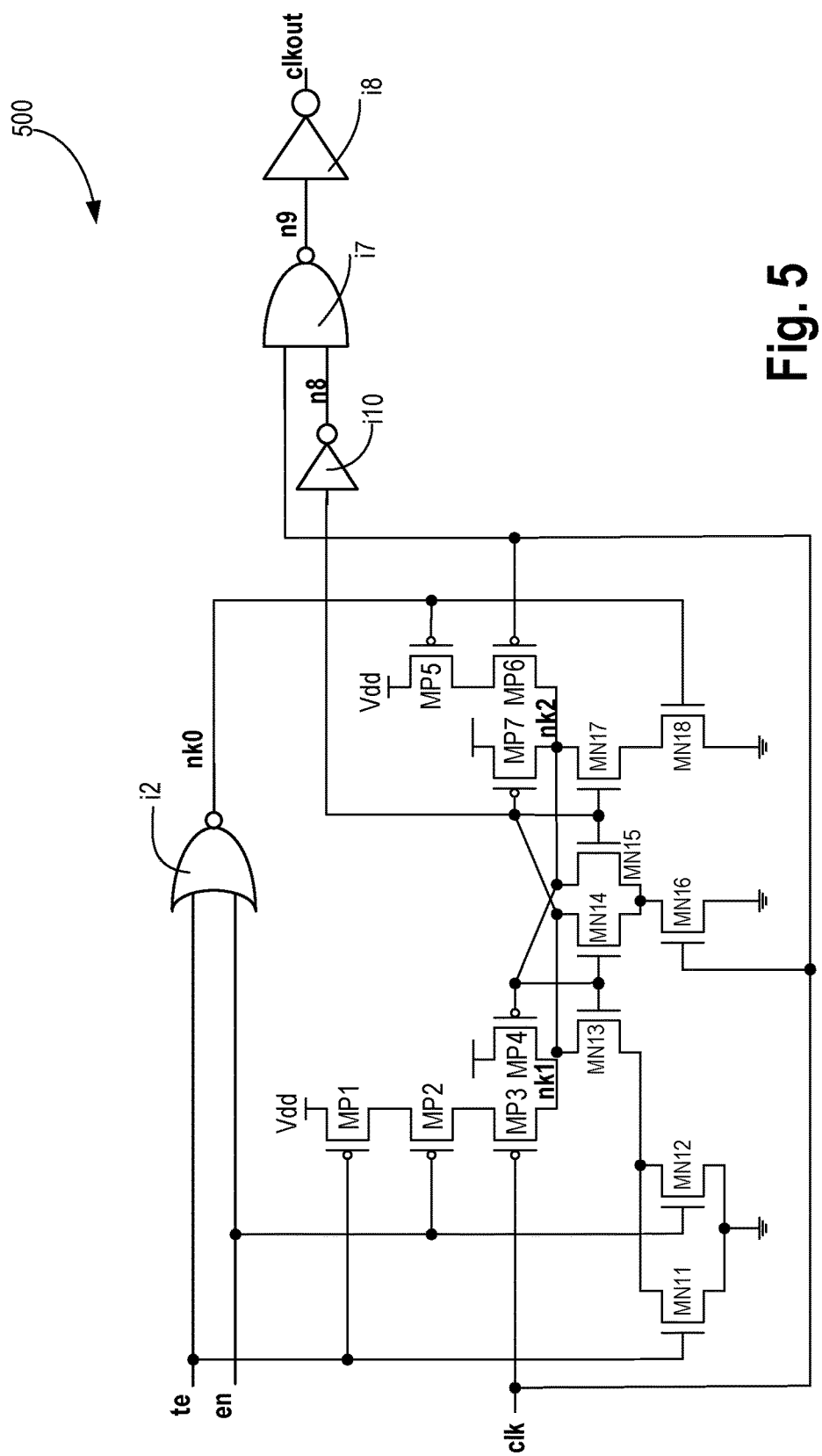
FIG. 5 illustrates an integrated clock gate circuit with embedded NOR and shared keeper, according to some embodiments of the disclosure.

FIG. 5 illustrates integrated clock gate circuit 500 with embedded NOR and shared keeper, according to some embodiments of the disclosure. It is pointed out that those elements of FIG. 5 having the same reference numbers (or names) as the elements of any other figure can operate or function in any manner similar to that described, but are not limited to such. So as not obscure the embodiment of FIG. 5, differences between FIG. 4 and FIG. 5 are described.

Circuit 500 is suitable to drive high power level integrated clock gate circuits. In some embodiments, when NAND gate i7 and inverter i8 are made larger in size to drive greater loads, the larger NAND gate i7 may add extra capacitance to node "nk2". To reduce that capacitance on node "nk2" and to maintain the same polarity, an inverter i10 is added between node "nk1" to produce an input of the NAND i7, in accordance with some embodiments. For example, the input of inverter i10 is coupled to node "nk1", and the output node "n8" of inverter i10 is coupled to NAND i7.

Figure 6:
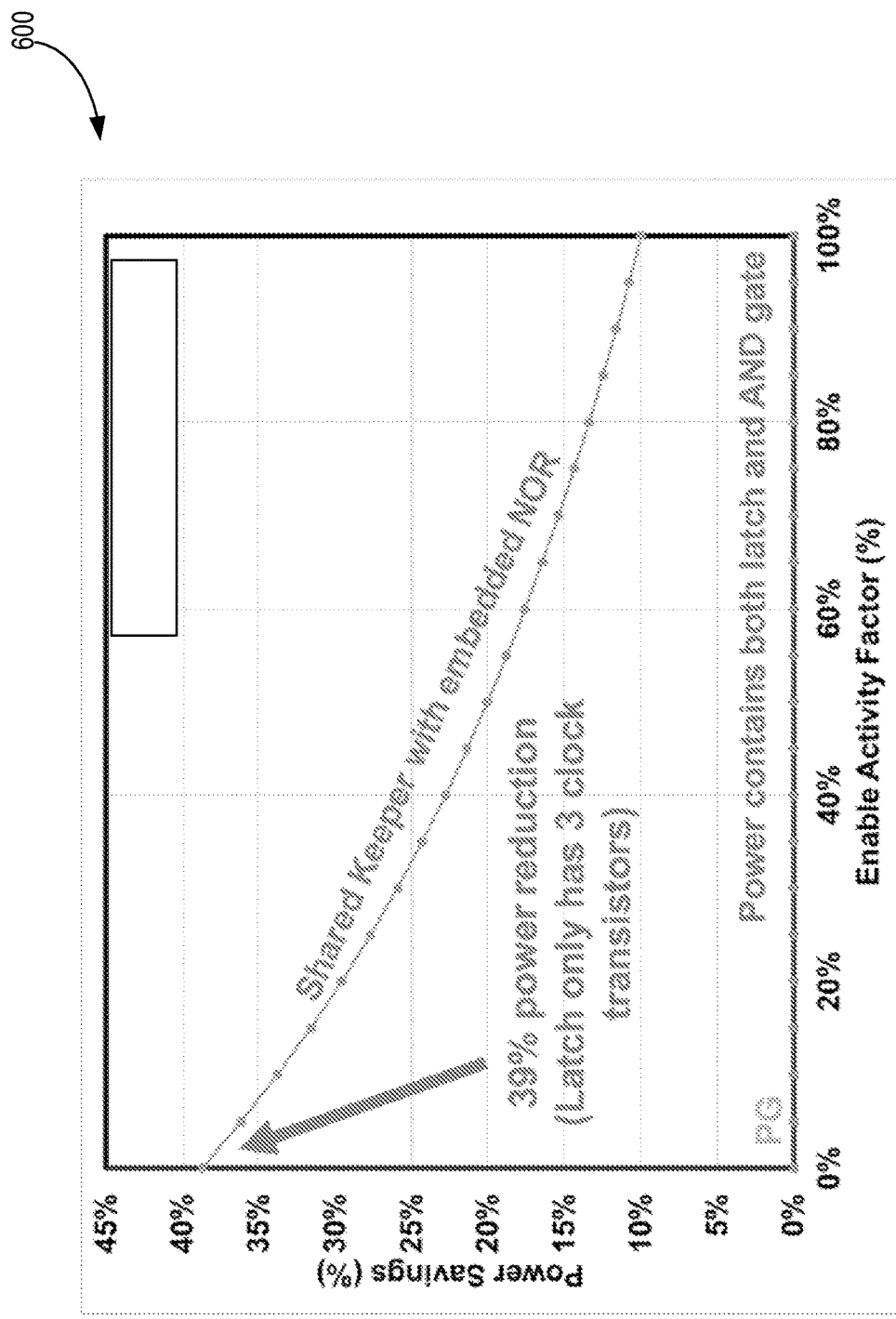
FIG. 6 illustrates a plot showing power savings using the integrated clock gate circuit of FIG. 4, according to some embodiments of the disclosure.

FIG. 6 illustrates plot 600 showing power savings using the integrated clock gate circuit of FIG. 4, according to some embodiments of the disclosure. Here, x-axis is enable activity factor in percentage (e.g., percentage of time enable node "en" is high), and y-axis is power savings in percentage. As enable activity factor reduces, power savings increase. For instance, there is power savings for all enable activity factors by using the shared keeper with embedded NOR (e.g., there is no breakeven point where power begins to lose).

Figure 7:
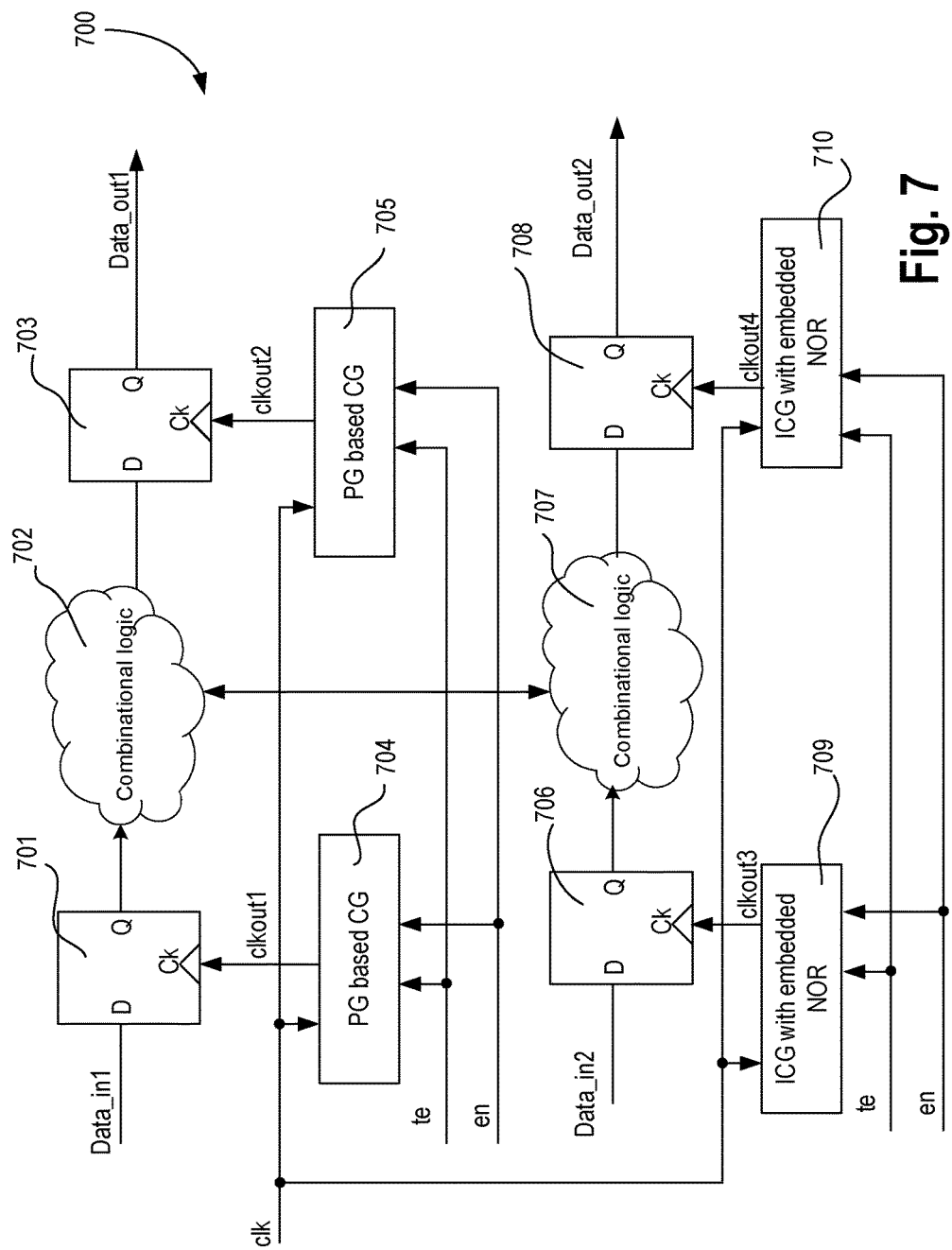
FIG. 7 illustrates a circuit using PG based integrated clock gate circuit for critical timing path and integrated clock gate circuit with embedded NOR for non-critical timing path, according to some embodiments of the disclosure.

FIG. 7 illustrates a circuit 700 using PG based integrated clock gate circuit for critical timing path and integrated clock gate circuit with embedded NOR for non-critical timing path, according to some embodiments of the disclosure. It is pointed out that those elements of FIG. 7 having the same reference numbers (or names) as the elements of any other figure can operate or function in any manner similar to that described, but are not limited to such.

In some embodiments, circuit 700 includes a critical timing path illustrated by the data path that includes sequential 701 (e.g., a flip-flop, latch, etc.), combinational logic 702, and sequential 703 (e.g., a flip-flop, latch, etc.). Input data "Data_in1" is received by sequential 701 which receives clock "clkout1" from a PG based clock gate 704 (e.g., circuit 100 of FIG. 1). The output of combination logic 702 is latched by sequential 703 which receives clock "clkout2" from a PG based clock gate 705. The output of sequential 703 is "Data_out1". As discussed with reference to FIG. 1, PG based clock gate 100 (e.g., 704 and 705) receive clock "clk", test enable "te" and enable "en"

In some embodiments, circuit 700 includes a non-critical timing path illustrated by the data path that includes sequential 706 (e.g., a flip-flop or latch), combinational logic 707, and sequential 708 (e.g., a flip-flop, latch, etc.). Input data "Data_in2" is received by sequential 706 which receives clock "clkout3" from AOI clock gate 709 with embedded NOR or shared keeper clock gate 709 with embedded NOR (e.g., circuits 200/300/400/500). The output of combination logic 707 is latched by sequential 708 which receives clock "clkout4" from AOI clock gate 710 with embedded NOR or shared keeper clock gate 710 with embedded NOR (e.g., circuits 200/300/400/500). The output of sequential 708 is "Data_out2".

Figure 8:
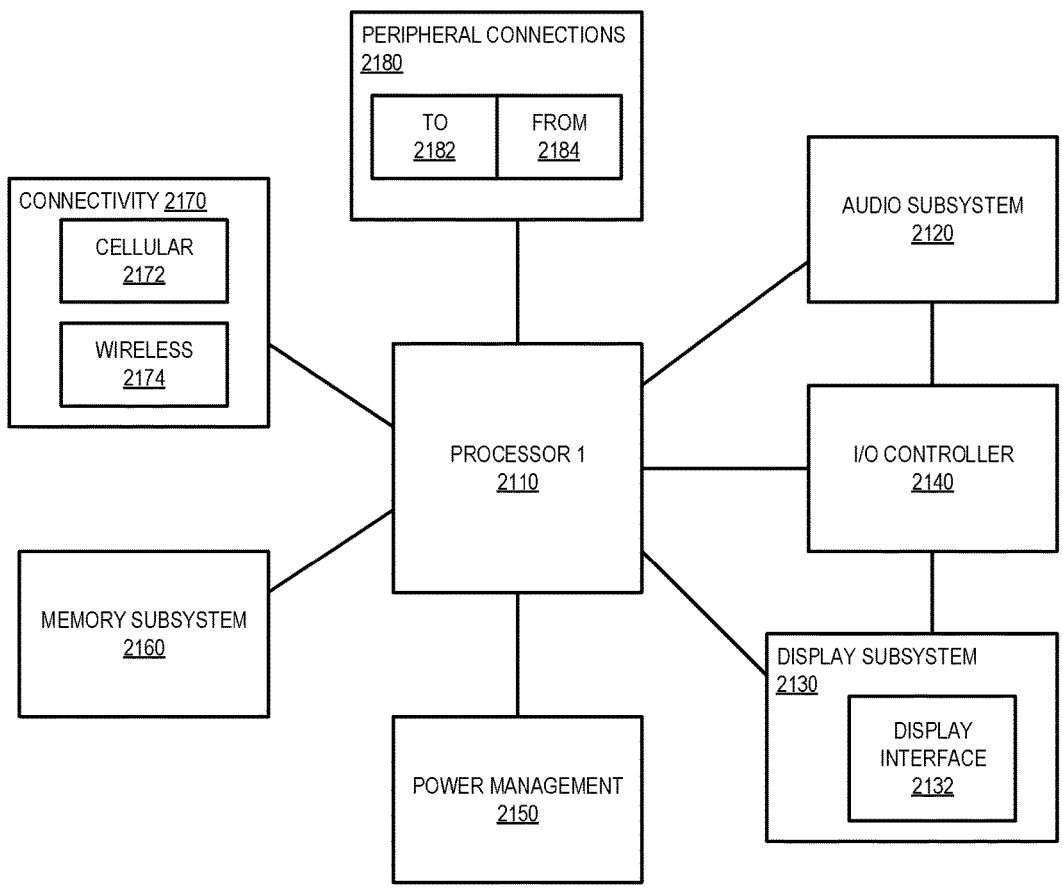
FIG. 8 illustrates a smart device or a computer system or a SoC (System-on-Chip) with integrated clock gate circuit with embedded NOR, in accordance with some embodiments.

FIG. 8 illustrates a smart device or a computer system or a SoC (System-on-Chip) with integrated clock gate circuit with embedded NOR, in accordance with some embodiments. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with integrated clock gate circuit having embedded NOR, according to some embodiments discussed. Other blocks of the computing device 2100 may also include an integrated clock gate circuit having embedded NOR according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), Display- Port including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a clock node; a test node; an enable node; and an AND-OR-INVERT (AOI) static latch coupled to the clock node, test node, and enable node, wherein the AOI static latch has embedded NOR functionality. In some embodiments, the apparatus comprises a NAND gate having a first input coupled to the clock node and a second input coupled to an output of the AOI static latch with embedded NOR functionality. In some embodiments, the apparatus comprises an inverter coupled to an output of the NAND gate, wherein the inverter is to provide an output. In some embodiments, the apparatus comprises a NOR gate having a first input coupled to the test node and a second input coupled to the enable node. In some embodiments, the AOI static latch with embedded NOR functionality comprises: a first p-type transistor having a gate terminal coupled to the test node and a source terminal coupled to a supply node; a second p-type transistor coupled in series with the first p-type transistor, wherein the second p-type transistor has a gate terminal coupled to the enable node; and a third p-type transistor coupled to the second p-type transistor, wherein the third p-type transistor has a gate terminal coupled to the clock node.

In some embodiments, the AOI static latch with embedded NOR functionality comprises a fourth p-type transistor coupled to the third p-type transistor such that a drain terminal of the fourth p-type transistor is coupled to a drain terminal of the third p-type transistor. In some embodiments, the AOI static latch with embedded NOR functionality comprises a first n-type transistor having a gate terminal coupled to the test node, and a drain terminal coupled to the drain terminals of the third and fourth p-type transistors. In some embodiments, the AOI static latch with embedded NOR functionality comprises: a second n-type transistor coupled in series with the third p-type transistor and coupled in parallel to the first n-type transistor, wherein the second n-type transistor has a gate terminal coupled to the test node; and a third n-type transistor coupled in parallel to the second n-type transistor, wherein the third n-type transistor having a gate terminal coupled to the clock node.

In some embodiments, the AOI static latch with embedded NOR functionality comprises a fourth n-type transistor coupled in series with the first, second, and third n-type transistors, wherein the fourth n-type transistor has a gate terminal coupled to a gate terminal of the fourth p-type transistor. In some embodiments, the AOI static latch with embedded NOR functionality comprises a fifth p-type transistor having a source terminal coupled to the supply node, and a gate terminal coupled to an output of the NOR gate. In some embodiments, the AOI static latch with embedded NOR functionality comprises a sixth p-type transistor coupled in series with the fifth p-type transistor.

In some embodiments, the AOI static latch with embedded NOR functionality comprises a seventh n-type transistor having a gate terminal coupled to the drain terminal of the fourth p-type transistor, a drain terminal coupled to the sixth p-type transistor and the gate terminals of the fourth p-type transistor and the fourth n-type transistor, and a source terminal coupled to the supply node. In some embodiments, the AOI static latch with embedded NOR functionality comprises: a fifth n-type transistor coupled in series with the seventh p-type transistor, the fifth n-type transistor having a gate terminal coupled to the clock node; and a sixth n-type transistor coupled in parallel with the fifth n-type transistor, the sixth n-type transistor having a gate terminal coupled to the output of the NOR gate.

In some embodiments, the AOI static latch with embedded NOR functionality comprises a seventh n-type transistor coupled in series with the fifth n-type transistor, wherein the seventh n-type transistor has a gate terminal coupled to the gate terminal of the seventh p-type transistor. In some embodiments, the apparatus comprises: a first inverter coupled to an output of the AOI static latch with embedded NOR functionality; a NAND gate having a first input coupled to the clock node and a second input coupled to an output of the first inverter; and a second inverter coupled to an output of the NAND gate.

In another example, a system is provided which comprises: a memory; and a processor coupled to the memory, the processor including an apparatus according to the apparatus described above; and a wireless interface for allowing the processor to communicate with another device.

In another example, an apparatus is provided which comprises: a critical timing path having a pass-gate based integrated clock gate; and a non-critical timing path electrically coupled to the critical timing path, wherein the non-critical timing path includes an AND-OR-Inverter (AOI) based integrated clock gate with embedded NOR functionality. In some embodiments, the pass-gate based integrated clock gate comprises: a first inverter having an input coupled to a clock node; a pass-gate having a p-type transistor with a gate terminal coupled to the clock node, and an n-type transistor having a gate terminal coupled to an output of the first inverter; a NOR gate having a first input coupled to a test node, a second input coupled to an enable node, and an output node coupled to the pass-gate; a memory device formed of two cross-coupled inverting devices which are coupled to the pass-gate; and a NAND gate having a first input coupled to the clock node and a second input coupled to an output of the pass-gate via an inverter.

In some embodiments, the AOI based integrated clock gate with embedded NOR functionality comprises: a clock node; a test node; an enable node; an AOI static latch coupled to the clock node, test node, and enable node; and a NAND gate having a first input coupled to the clock node and a second input coupled to an output of the AOI static latch with embedded NOR functionality.

In another example, a system is provided which comprises: a memory; and a processor coupled to the memory, the processor including an apparatus according to the apparatus described above; and a wireless interface for allowing the processor to communicate with another device.

In another example, a method is provided which comprises: positioning a pass-gate based integrated clock gate in a critical timing path having; and positioning a AND-OR-Inverter (AOI) based integrated clock gate with embedded NOR functionality in a non-critical timing path, wherein the non-critical timing path is electrically coupled to the critical timing path. In some embodiments, the pass-gate based integrated clock gate comprises: a first inverter having an input coupled to a clock node; a pass-gate having a p-type transistor with a gate terminal coupled to the clock node, and an n-type transistor having a gate terminal coupled to an output of the first inverter; a NOR gate having a first input coupled to a test node, a second input coupled to an enable node, and an output node coupled to the pass-gate; a memory device formed of two cross-coupled inverting devices which are coupled to the pass-gate; and a NAND gate having a first input coupled to the clock node and a second input coupled to an output of the pass-gate via an inverter. In some embodiments, the AOI based integrated clock gate with embedded NOR functionality comprises: a clock node; a test node; an enable node; an AOI static latch coupled to the clock node, test node, and enable node; and a NAND gate having a first input coupled to the clock node and a second input coupled to an output of the AOI static latch with embedded NOR functionality.

In another example, an apparatus is provided which comprises: a clock node; a test node; an enable node; and means for latching with embedded NOR functionality, wherein the means for latching are coupled to the clock node, the test node, and the enable node. In some embodiments, the apparatus comprises a NAND gate having a first input coupled to the clock node and a second input coupled to an output of the means for latching.

In another example, a system is provided which comprises: a memory; and a processor coupled to the memory, the processor including an apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
an AND-OR-INVERT (AOI) static latch coupled to a clock node, test node, and enable node, wherein the AOI static latch has embedded NOR logic;
a NAND gate having a first input coupled to the clock node and a second input coupled to an output of the AOI static latch; and
an inverter coupled to an output of the NAND gate, wherein the inverter is to provide an output, wherein the AOI static latch comprises:
a first device of a first conductivity type, wherein the first device includes a gate terminal coupled to the test node and a source terminal coupled to a power supply rail;
a second device of the first conductivity type, wherein the second device is coupled in series with the first device, wherein the second device has a gate terminal coupled to the enable node;
a third device of the first conductivity type coupled to the second device, wherein the third device has a gate terminal coupled to the clock node;
a fourth device of the first conductivity type, wherein the fourth device is coupled to the third device such that a drain terminal of the fourth device is coupled to a drain terminal of the third device;
a fifth device of a second conductivity type, the fifth device having a gate terminal coupled to the test node, and a drain terminal coupled to the drain terminals of the third and fourth devices;
a sixth device of the second conductivity type, the sixth device coupled in series with the third device and coupled in parallel to the fifth device, wherein the sixth device has a gate terminal coupled to the enable node;
a seventh device of the second conductivity type, wherein the seventh device is coupled in parallel to the sixth device, wherein the seventh device has a gate terminal coupled to the clock node; and
an eighth device of the second conductivity type, wherein the eighth device is coupled in series with the fifth, sixth, and seventh devices, wherein the eighth device has a gate terminal coupled to a gate terminal of the fourth device.

2. The apparatus of claim 1 comprises a NOR gate having a first input coupled to the test node and a second input coupled to the enable node.

3. The apparatus of claim 2, wherein the AOI static latch with embedded NOR logic comprises a ninth device of the first conductivity type, the ninth device having a source terminal coupled to the power supply rail, and a gate terminal coupled to an output of the NOR gate.

4. The apparatus of claim 3, wherein the AOI static latch with embedded NOR logic comprises a tenth device of the first conductivity type, the tenth device coupled in series with the ninth device.

17

5. The apparatus of claim 4, wherein the AOI static latch with embedded NOR logic comprises an eleventh device of the first conductivity type, the eleventh device having a gate terminal coupled to the drain terminal of the fourth device, a drain terminal coupled to the tenth device and the gate terminals of the fourth device and the eighth device, and a source terminal coupled to the power supply rail.

6. The apparatus of claim 5, wherein the AOI static latch with embedded NOR logic comprises:
   a twelfth device of the second conductivity type, the twelfth device coupled in series with the eleventh, wherein the twelfth device has a gate terminal coupled to the clock node; and
   a thirteenth device of the second conductivity type, the thirteenth device coupled in parallel with the twelfth device, wherein the thirteenth device has a gate terminal coupled to the output of the NOR gate.

7. The apparatus of claim 6, wherein the AOI static latch with embedded NOR logic comprises a fourteenth device of the second conductivity type, the fourteenth device coupled in series with the twelfth device, wherein the fourteenth device has a gate terminal coupled to the gate terminal of the eleventh device.

8. An apparatus comprising:
   a critical timing path having a pass-gate based integrated clock gate; and
   a non-critical timing path electrically coupled to the critical timing path, wherein the non-critical timing path includes an AND-OR-Inverter (AOI) based integrated clock gate with embedded NOR logic, wherein the AOI integrated clock gate comprises:
   a first device of a first conductivity type, wherein the first device includes a gate terminal coupled to a test node and a source terminal coupled to a power supply rail;
   a second device of the first conductivity type, wherein the second device is coupled in series with the first device, wherein the second device has a gate terminal coupled to an enable node;
   a third device of the first conductivity type coupled to the second device, wherein the third device has a gate terminal coupled to a clock node;
   a fourth device of the first conductivity type, wherein the fourth device is coupled to the third device such that a drain terminal of the fourth device is coupled to a drain terminal of the third device;
   a fifth device of a second conductivity type, the fifth device having a gate terminal coupled to the test node, and a drain terminal coupled to the drain terminals of the third and fourth devices;
   a sixth device of the second conductivity type, the sixth device coupled in series with the third device and coupled in parallel to the fifth device, wherein the sixth device has a gate terminal coupled to the enable node;
   a seventh device of the second conductivity type, wherein the seventh device is coupled in parallel to the sixth device, wherein the seventh device having a gate terminal coupled to the clock node; and
   an eighth device of the second conductivity type, wherein the eighth device is coupled in series with the fifth, sixth, and seventh devices, wherein the eighth device has a gate terminal coupled to a gate terminal of the fourth device.

9. The apparatus of claim 8, wherein the pass-gate based integrated clock gate comprises:
   a first inverter having an input coupled to a clock node;
   a pass-gate having a first transistor of the first conductivity type with a gate terminal coupled to the clock node, and a second transistor of the second conductivity type, wherein the second transistor having a gate terminal coupled to an output of the first inverter;
   a NOR gate having a first input coupled to a test node, a second input coupled to an enable node, and an output node coupled to the pass-gate;
   a memory device comprising of two cross-coupled inverting structures which are coupled to the pass-gate; and
   a NAND gate having a first input coupled to the clock node and a second input coupled to an output of the pass-gate via a second inverter.

10. The apparatus of claim 9, wherein the AOI based integrated clock gate with embedded NOR logic comprises:
    a NAND gate having a first input coupled to the clock node and a second input coupled to an output of the AOI static latch with embedded NOR logic.

11. A system comprising:
    a memory; and
    a processor coupled to the memory, the processor including:
    an AND-OR-INVERT (AOI) static latch coupled to a clock node, test node, and enable node, wherein the AOI static latch has embedded NOR logic which comprises:
    a first inverter coupled to an output of the AOI static latch;
    a NAND gate having a first input coupled to the clock node and a second input coupled to an output of the first inverter; and
    a second inverter coupled to an output of the NAND gate, wherein the second inverter is to provide an output;
    a first device of a first conductivity type, wherein the first device includes a gate terminal coupled to a test node and a source terminal coupled to a power supply rail;
    a second device of the first conductivity type, wherein the second device is coupled in series with the first device, wherein the second device has a gate terminal coupled to an enable node;
    a third device of the first conductivity type coupled to the second device, wherein the third device has a gate terminal coupled to a clock node;
    a fourth device of the first conductivity type, wherein the fourth device is coupled to the third device such that a drain terminal of the fourth device is coupled to a drain terminal of the third device;
    a fifth device of a second conductivity type, the fifth device having a gate terminal coupled to the test node, and a drain terminal coupled to the drain terminals of the third and fourth devices;
    a sixth device of the second conductivity type, the sixth device coupled in series with the third device and coupled in parallel to the fifth device, wherein the sixth device has a gate terminal coupled to the enable node;
    a seventh device of the second conductivity type, wherein the seventh device is coupled in parallel to the sixth device, wherein the seventh device has a gate terminal coupled to the clock node; and
    an eighth device of the second conductivity type, wherein the eighth device is coupled in series with the fifth, sixth, and seventh devices, wherein the eighth device has a gate terminal coupled to a gate terminal of the fourth device; and
    a wireless interface to allow the processor to communicate with another device.

12. An apparatus comprising:
a first device of a first conductivity type, wherein the first device includes a gate terminal coupled to a first node and a source terminal coupled to a power supply rail;
a second device of the first conductivity type, wherein the second device is coupled in series with the first device, wherein the second device has a gate terminal coupled to a second node;
a third device of the first conductivity type coupled to the second device, wherein the third device has a gate terminal coupled to a third node;
a fourth device of the first conductivity type, wherein the fourth device is coupled to the third device such that a drain terminal of the fourth device is coupled to a drain terminal of the third device;
a fifth device of a second conductivity type, the fifth device having a gate terminal coupled to a gate terminal of the fourth device, and a drain terminal coupled to the drain terminals of the third and fourth devices;
a sixth device of the second conductivity type, the sixth device coupled in series with the fifth device, wherein the sixth device has a gate terminal coupled to the first node; and
a seventh device of the second conductivity type, wherein the seventh device is coupled in parallel to the sixth device, wherein the seventh device having a gate terminal coupled to the second node.

13. An apparatus comprising:
a first device of a first conductivity type, wherein the first device includes a gate terminal coupled to a first node and a source terminal coupled to a power supply rail;
a second device of the first conductivity type, wherein the second device is coupled in series with the first device, wherein the second device has a gate terminal coupled to a second node;
a third device of the first conductivity type coupled to the second device, wherein the third device has a gate terminal coupled to a third node;
a fourth device of the first conductivity type, wherein the fourth device is coupled to the third device such that a drain terminal of the fourth device is coupled to a drain terminal of the third device;
a fifth device of a second conductivity type, the fifth device having a gate terminal coupled to a gate terminal of the fourth device, and a drain terminal coupled to the drain terminals of the third and fourth devices;
a sixth device of the second conductivity type, the sixth device coupled in series with the fifth device, wherein the sixth device has a gate terminal coupled to the first node; and
a seventh device of the second conductivity type, wherein the seventh device is coupled in parallel to the sixth device, wherein the seventh device having a gate terminal coupled to the second node.

14. The apparatus of claim 13, wherein the first node is to provide a test signal, wherein the second node is to provide an enable signal, and wherein the third node is to provide a clock.

* * * * *